US011917792B2

(12) United States Patent
Sultenfuss et al.

(10) Patent No.: US 11,917,792 B2
(45) Date of Patent: Feb. 27, 2024

(54) DUAL OPPOSED OUTLET FAN WITH TWO IMPELLERS

(71) Applicant: Dell Products L.P., Round Rock, TX (US)

(72) Inventors: Andrew Thomas Sultenfuss, Leander, TX (US); Qinghong He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 177 days.

(21) Appl. No.: 17/387,362

(22) Filed: Jul. 28, 2021

(65) Prior Publication Data
US 2023/0034086 A1 Feb. 2, 2023

(51) Int. Cl.
*H05K 7/20* (2006.01)

(52) U.S. Cl.
CPC ..... *H05K 7/20172* (2013.01); *H05K 7/20336* (2013.01); *H05K 7/20736* (2013.01)

(58) Field of Classification Search
CPC .......... H05K 7/20172; H05K 7/20736; H05K 7/20336; F04D 29/4246; F04D 29/281; G06F 1/203

See application file for complete search history.

(56) References Cited

U.S. PATENT DOCUMENTS

| 5,772,500 | A | * | 6/1998 | Harvey | G06F 1/20 415/206 |
|---|---|---|---|---|---|
| 8,333,547 | B2 | | 12/2012 | Hsu et al. | |
| 10,584,717 | B1 | * | 3/2020 | He | F04D 29/422 |
| 2008/0063532 | A1 | * | 3/2008 | Hsu | F04D 25/166 416/223 R |
| 2011/0189004 | A1 | * | 8/2011 | Dybenko | F04D 29/441 415/203 |
| 2012/0261101 | A1 | * | 10/2012 | Takahashi | G06F 1/203 415/206 |
| 2018/0352676 | A1 | * | 12/2018 | Degner | H05K 7/20154 |
| 2021/0161034 | A1 | * | 5/2021 | Jeong | H02J 50/10 |

* cited by examiner

*Primary Examiner* — Frantz F Jules
*Assistant Examiner* — Martha Tadesse
(74) *Attorney, Agent, or Firm* — McDermott Will & Emery LLP

(57) ABSTRACT

A cooling system for an information handling system in a portable chassis comprises a fan housing containing two counterrotating impellers, wherein the axes of rotation of the two impellers are aligned with an axis of orientation relative to a rear surface of the portable chassis. By changing the angle of the axis of orientation, impellers with larger diameters may be positioned in the same fan area for increased volumetric airflow. The shape of the fan housing, the diameter of each impeller and the angle of the axis of orientation may be selected to direct and distribute a greater volumetric airflow for improved cooling of components in the portable chassis.

16 Claims, 5 Drawing Sheets

FIG. 5

| | DESCRIPTION | IMPELLER SIZE | ESTIMATED SPEED AT 1.7Sone SYSTEM ACOUSTIC | TOTAL AIR FLOW |
|---|---|---|---|---|
| 502-1 | SINGLE 70 mm x 70 mm | 62 mm | 2830 RPM | 6.8 CFM |
| 502-2 | TWO 44 mm x 44 mm IMPELLERS | 44 mm | 3450 RPM | 7.7 CFM |
| 502-3 | TWO IDENTICAL COUNTERROTATING IMPELLERS | 49 mm | 3162 RPM | 8.3 CFM |
| 502-4 | TWO DIFFERENT SIZED COUNTERROTATING IMPELLERS | 62 mm + 30 mm | 4924 RPM + 2462 RPM | 8.2 CFM |

DUAL OPPOSED OUTLET FAN WITH TWO IMPELLERS

BACKGROUND

Field of the Disclosure

This disclosure relates generally to systems for cooling components and portable chassis of information handling systems and, more particularly, to cooling systems with hyperbaric fans.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A hyperbaric fan offers key improvements for cooling information handling systems.

SUMMARY

Embodiments disclosed herein may be generally directed to information handling systems and cooling systems for cooling components in a portable information system portable chassis.

Embodiments may be directed to a cooling system for an information handling system in a portable chassis. The cooling system may include a fan housing defined by a fan width and a fan length. The fan housing may comprise an inlet proximate a bottom cover of the portable chassis and a fan outlet on a first side of the fan housing. The cooling system may contain a first impeller positioned in the fan housing and configured to rotate in a first direction about a first axis of rotation, a second impeller positioned in the fan housing and configured to rotate in a second direction opposite the first direction about a second axis of rotation, and a controller operable to cause the first impeller to rotate at a first rotational speed and the second impeller to rotate at a second rotational speed. During operation, the first impeller and the second airflow rotate to generate an airflow. The axes of rotation of the first impeller and the second impeller are aligned with an axis of orientation that is non-parallel with a rear surface of the portable chassis and the fan housing has a shape configured to direct at least a portion of the airflow out the fan outlet.

In some embodiments, the fan housing is configured to direct a portion of the airflow through a fin stack. In some embodiments, the fan housing has a shape configured to distribute at least a portion of the airflow along the fin stack.

In some embodiments, the fan housing has a truncated shape. In some embodiments, the fan housing has a curved side.

In some embodiments, the fan housing is positioned in a fan area with the curved side proximate a heat pipe. In some embodiments, the fan housing is asymmetric relative to the fan width.

In some embodiments, the first impeller and the second impeller have the same diameter. In some embodiments, the first impeller has a first diameter, the second impeller has a second diameter smaller than the first diameter. And the controller is configured to operate the first impeller at a first rotational speed and operate the second impeller at a second rotational speed greater than the first rotational speed. In some embodiments, the first rotational speed is proportional to the second rotational speed.

BRIEF DESCRIPTION OF THE DRAWINGS

For a more complete understanding of the invention and its features and advantages, reference is now made to the following description, taken in conjunction with the accompanying drawings, in which:

FIG. 5 is a chart depicting estimated fan speeds and total air flows for a single impeller in a fan housing, two fans in separate fan housings, and variations of two impellers in a single fan housing.

DESCRIPTION OF PARTICULAR EMBODIMENT(S)

Figure 1:
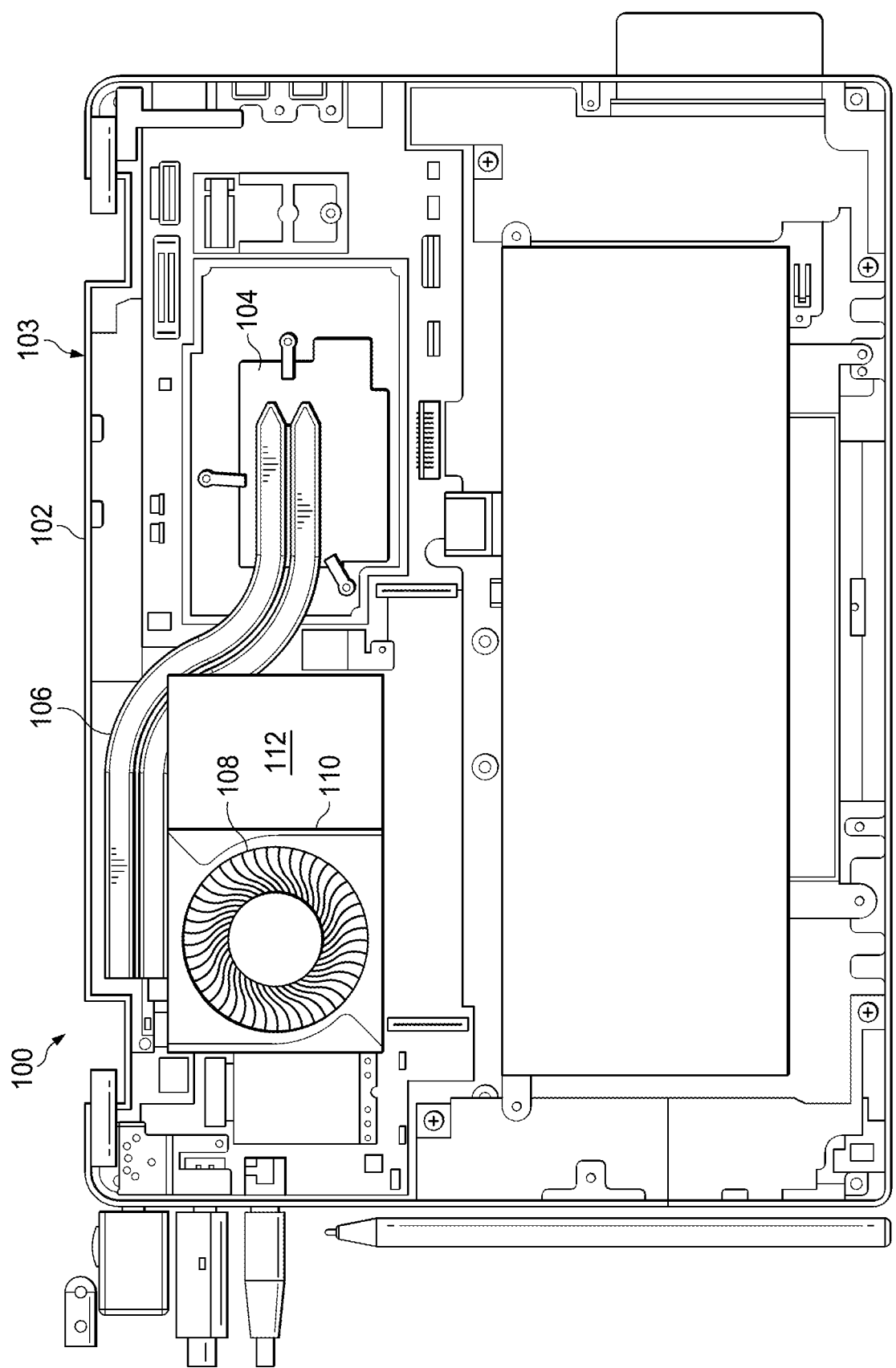
FIG. 1 depicts a top cutaway view of an information handling system portable chassis, illustrating components and a fan area with a single fan.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, impeller "108-1" refers to an instance of a fan impeller, which may be referred to collectively as impellers "108" and any one of which may be referred to generically as impeller "108."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

Embodiments disclosed herein include a cooling system comprising a fan housing containing two counterrotating impellers with their respective axes of rotation on an axis of orientation, wherein the size of each impeller, the angle of the axis of orientation relative to a rear surface of the portable chassis, and the shape of the fan housing provide increased volumetric flow rate of an airflow relative to the portable chassis and distribution of the airflow.

Embodiments may be configured for positioning in fan areas in which the ratio of a fan area width relative to a fan area length is disproportionate.

Embodiments disclosed herein are described with respect to an information handling system contained in a sealed portable chassis. Particular embodiments are best understood by reference to FIGS. 1-5, wherein like numbers are used to indicate like and corresponding parts.

Turning to the drawings, FIG. 1 depicts a cutaway top view of an information handling system 100 contained in portable chassis 102. Portable chassis 102 may refer to, for example, a laptop computer shell containing and protecting components of information handling system 100. A top cover (not shown) often includes or forms part of a hinged display. A bottom cover (not visible) of portable chassis 102 often includes an opening for receiving cool air into portable chassis 102. The bottom cover may transition at the edges (partially visible in FIG. 1) to form a portion of the sides and a rear surface of portable chassis 102. The sides often comprise input/output ports for receiving network cabling and other peripheral connections and memory card access slots. A rear surface 103 typically has a vent for exhausting hot air out of portable chassis 102 and may include a power port or additional peripheral connections. As used herein, the sides of portable chassis 102 may refer to the left and right hand edges and rear surface 103 of portable chassis 102 may refer to the top edge of FIG. 1.

Portable chassis 102 of information handling system 100 may contain components of a processor subsystem, a memory subsystem, an I/O subsystem, local storage resources, a battery, and a network interface.

Information handling system 100 may contain a processor subsystem comprising a system, device, or apparatus operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, components of a processor subsystem may interpret and execute program instructions and process data stored locally (e.g., in a memory subsystem). In the same or alternative embodiments, components of a processor subsystem may interpret and execute program instructions and process data stored remotely (e.g., in a network storage resource).

Information handling system 100 may contain a memory subsystem comprising a system, device, or apparatus operable to retain and retrieve program instructions and data for a period of time (e.g., computer-readable media). A memory subsystem may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

Information handling system 100 may contain an input/output (I/O) subsystem comprising a system, device, or apparatus generally operable to receive and transmit data to or from or within information handling system 100. An I/O subsystem may represent, for example, a variety of communication interfaces, graphics interfaces, video interfaces, user input interfaces, and peripheral interfaces. In various embodiments, an I/O subsystem may be used to support various peripheral devices, such as a touch panel, a display adapter, a keyboard, a touch pad, or a camera, among other examples. In some implementations, an I/O subsystem may support so-called 'plug and play' connectivity to external devices, in which the external devices may be added or removed while information handling system 100 is operating.

Information handling system 100 may contain a local storage resource comprising computer-readable media (e.g., hard disk drive, floppy disk drive, CD-ROM, and other type of rotating storage media, flash memory, EEPROM, or another type of solid-state storage media) and may be generally operable to store instructions and data.

Information handling system 100 may contain a network interface comprising a suitable system, apparatus, or device operable to serve as an interface between information handling system 100 and a network (not shown). A network interface may enable information handling system 100 to communicate over a network using a suitable transmission protocol or standard. In some embodiments, a network interface may be communicatively coupled via a network to a network storage resource (not shown). A network coupled to a network interface may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to a network interface may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. A network coupled to a network interface or various components associated therewith may be implemented using hardware, software, or any combination thereof.

Information handling system 100 may contain a system bus comprising any of a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

In some embodiments, a component may be a central processing unit (CPU) 104 and include a cold plate or other apparatus for transferring heat from CPU 104 to one or more heat pipes 106. Heat pipes 106 may transfer heat away from CPU 104 to a fin stack (not shown) near a fan outlet of fan housing 110 located in fan area 112. In some information handling systems 100, impeller 108 located in fan housing 110 may rotate to draw in air from an opening in a bottom cover (not visible) in portable chassis 102 and generate an airflow such that heat from heat pipes 106 is transferred out of rear surface 103 of portable chassis 102. In some information handling systems 100, fan housing 110 and impeller 108 may form part of a dual-opposed outlet (DOO) fan, wherein impeller 108 located in fan housing 110 may rotate to draw in air from an opening in a bottom cover (not visible) in portable chassis 102 and generate an airflow such a first portion of the airflow exits a first fan outlet proximate heat pipes 106 such that heat from heat pipes is transferred out a vent or other opening in rear surface 103 of portable chassis 102 and a second portion of the airflow exits a second fan outlet opposite the first fan outlet such that heat from other components inside portable chassis 102 is transferred to the ambient environment.

As depicted in FIG. 1, fan area 112 may have a fan area width and a fan area length, wherein the fan area width is greater than the fan area length. In portable chassis 102, a ratio of the fan area width may be greater than the fan area length. A ratio may be approximately 1.5, wherein the fan area width is approximately 1.5 times the fan area length. Fan housing 110 has a fan length and a fan width. However, one or both of fan length and the fan width might not match the fan area width or the fan area length. For example, fan housing 110 may be generally square based on a single impeller 108 and have a fan width of 70 mm and a fan length of 70 mm, whereas fan area 112 may have a fan area width of 100 mm and a fan area length of 70 mm. For fan housing 110 having dimensions of 70 mm×70 mm, approximately 30 mm of the fan area length may be unused or underutilized.

As depicted in FIG. 1, portable chassis 102 may be assembled such that heat pipes 106 may overlap a portion of rectangular fan area 112. In these portable chassis 102, heat pipes 106 may prevent positioning fan housing 110 closer to CPU 104. Heat pipes 106 are limited in how much they can bend to go around fan housing 110. Fan area 112 may be limited by other components in portable chassis 102 such that increasing the fan area length may not be possible. As a result, in many portable chassis 102 of information handling systems 100, at least a portion of fan area 112 is unusable. However, advancements in CPUs 104 and other components generally result in components generating more heat such that more airflow is desirable. Increasing the fan speed may not be possible due to users wanting a quiet information handling system.

Embodiments disclosed herein increase cooling airflow in a portable chassis 102 of information handling system 100 with a cooling system comprising a fan housing containing two counterrotating impellers 108, wherein the impellers 108 may have the same diameter or different diameter and their axes of rotation may be aligned with an axis of orientation that is non-parallel with a rear surface of portable chassis 102. Embodiments may be particularly well suited for rectangular fan areas 112 in which the ratio of the fan area width/fan area length is approximately 1.5.

Counterrotating Impellers in a Single Fan Housing Generate More Airflow

Figure 2:
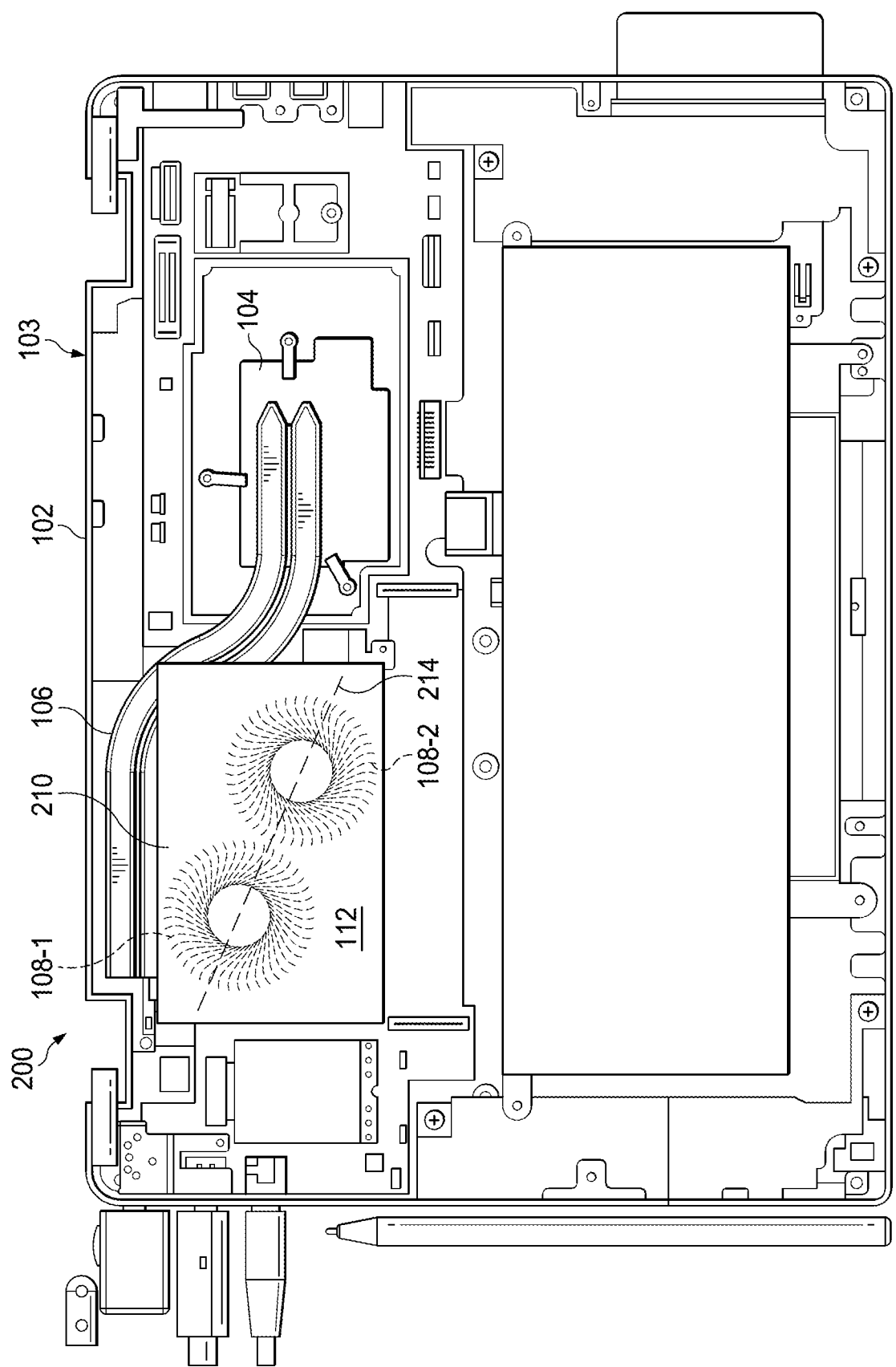
FIG. 2 depicts a top cutaway view of an information handling system portable chassis, illustrating components and a fan area with two impellers with centers of rotation aligned relative to an axis non-parallel with a rear surface of the portable chassis.

FIG. 2 is a top view of information handling system 100 in portable chassis 102. Cooling system comprising fan housing 210 comprising two counterrotating impellers 108-1 and 108-2 is positioned in fan area 112. The axes of rotation of impellers 108-1 and 108-2 are aligned relative to axis of orientation 214. As depicted in FIG. 2, the axes of rotation of impellers 108-1 and 108-2 may be aligned along axis of orientation 214 that is non-parallel with rear surface 103 of portable chassis 102. FIG. 2 depicts fan housing 210 as generally rectangular. However, depending on the diameters and positions of impellers 108, embodiments of fan housing 210 may be configured with different shapes to accommodate heat pipes 106 and components inside portable chassis and provide a desired airflow in a direction to maximize cooling benefits of a cooling system, discussed in greater detail below. In some embodiments, impellers 108 and fan housing 210 form part of a dual opposed outlet (DOO) cooling system in which air enters each impeller 108 through an opening located in a bottom cover of a sealed portable chassis 102, impellers 108 generate an airflow and fan housing 210 comprises two outlets, wherein a first outlet directs a first portion of the airflow across heat pipes 106 to remove heat from heat pipes 106 out a vent in rear surface 103 of portable chassis 102 and a second outlet directs a second portion of the airflow inside portable chassis 102. In a sealed portable chassis 102, the second portion of the airflow may result in hyperbaric conditions that cause convective heat transfer from components inside portable chassis 102 out of portable chassis 102.

Figure 3:
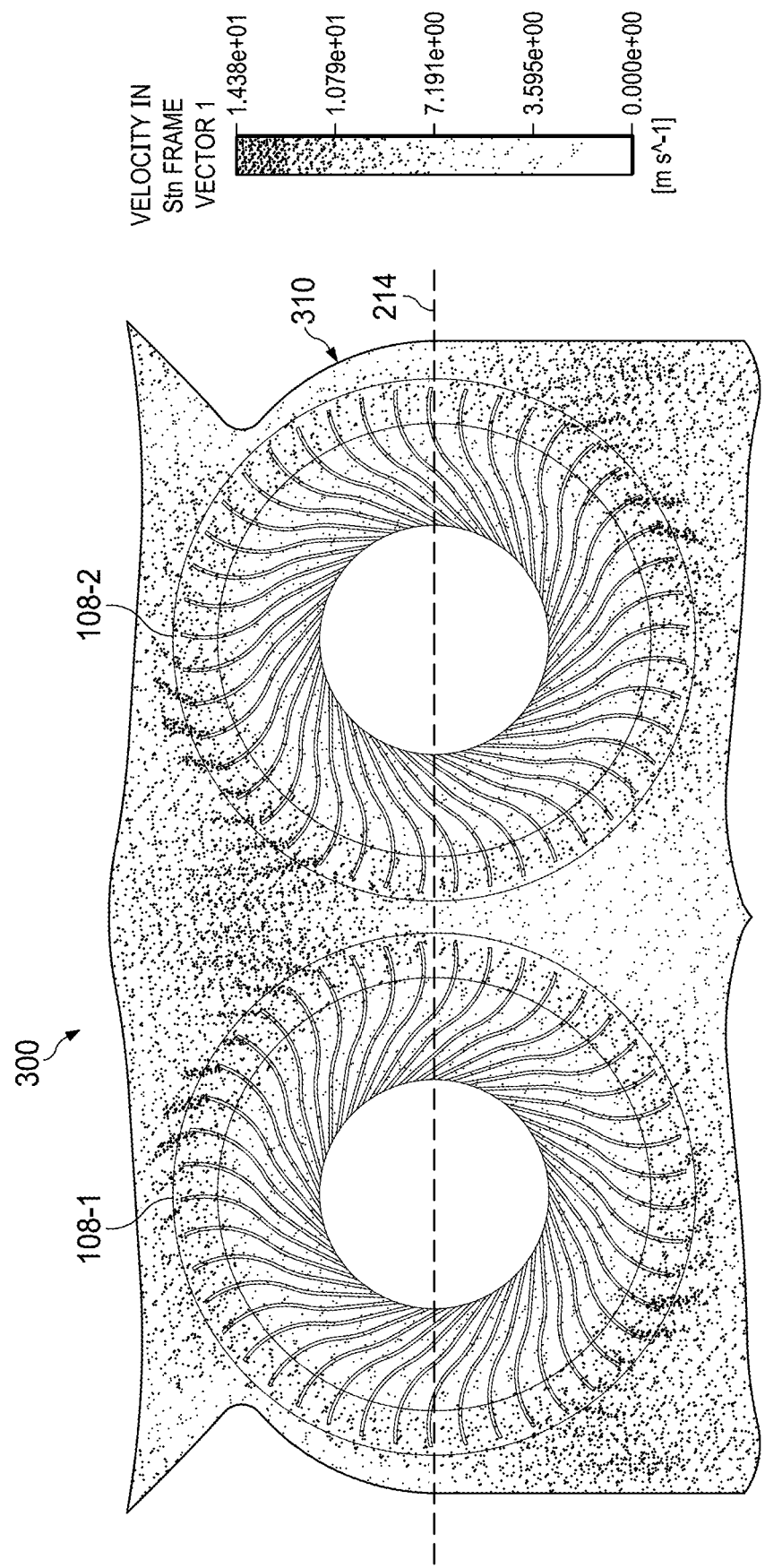
FIG. 3 depicts a simulated airflow profile for a fan having two impellers of the same size with centers of rotation aligned relative to an axis parallel with a rear surface of the portable chassis.

Two Impellers with Axes of Rotation Aligned with an Axis of Orientation Generate More Airflow FIG. 3 depicts an image of a simulated airflow velocity profile 300 of a cooling system comprising two counterrotating impellers 108 of the same diameter generating an airflow, with the axes of rotation of impellers 108 being aligned relative to axis of orientation 214 that is approximately parallel with rear surface 103 of portable chassis 102. In some embodiments, positioning two impellers 108 with their axes of rotation aligned on axis of orientation 214 that is parallel with rear surface 103 of portable chassis 102 may ensure airflow exiting portable chassis 102 has a higher velocity. As depicted in FIG. 3, a velocity of airflow exiting fan housing 310 may reach approximately 7 m/s.

Axis of Orientation May Direct Airflow

As depicted in FIG. 3, the airflow generated by two counterrotating impellers 108 of equal size may exit fan housing 310 approximately orthogonal to axis of orientation 214. By changing the angle of the axis of orientation 214, the direction of airflow exiting fan housing 310 may be changed as well. Positioning two impellers 108 with their axes of rotation aligned on axis of orientation 214 that is parallel with rear surface 103 of portable chassis 102 may ensure at least a portion of the airflow passes through a fin stack (not shown) coupled to heat pipes 106 and exits a vent in rear surface 103 of portable chassis 102 directly proximate fan area 112.

Shape of Fan Housing May Direct or Distribute Airflow

A shape of fan housing 310 may direct or distribute airflow for improved cooling. In some embodiments, a shape of fan housing 310 may be symmetric relative to the fan area length, such as depicted in FIG. 3. In some embodiments, fan housing 310 may be configured to distribute the airflow such that a first portion has a first volumetric flowrate and velocity for cooling heat pipes 106 and a second portion has a second volumetric flowrate and velocity for cooling other components in portable chassis 102.

Figure 4:
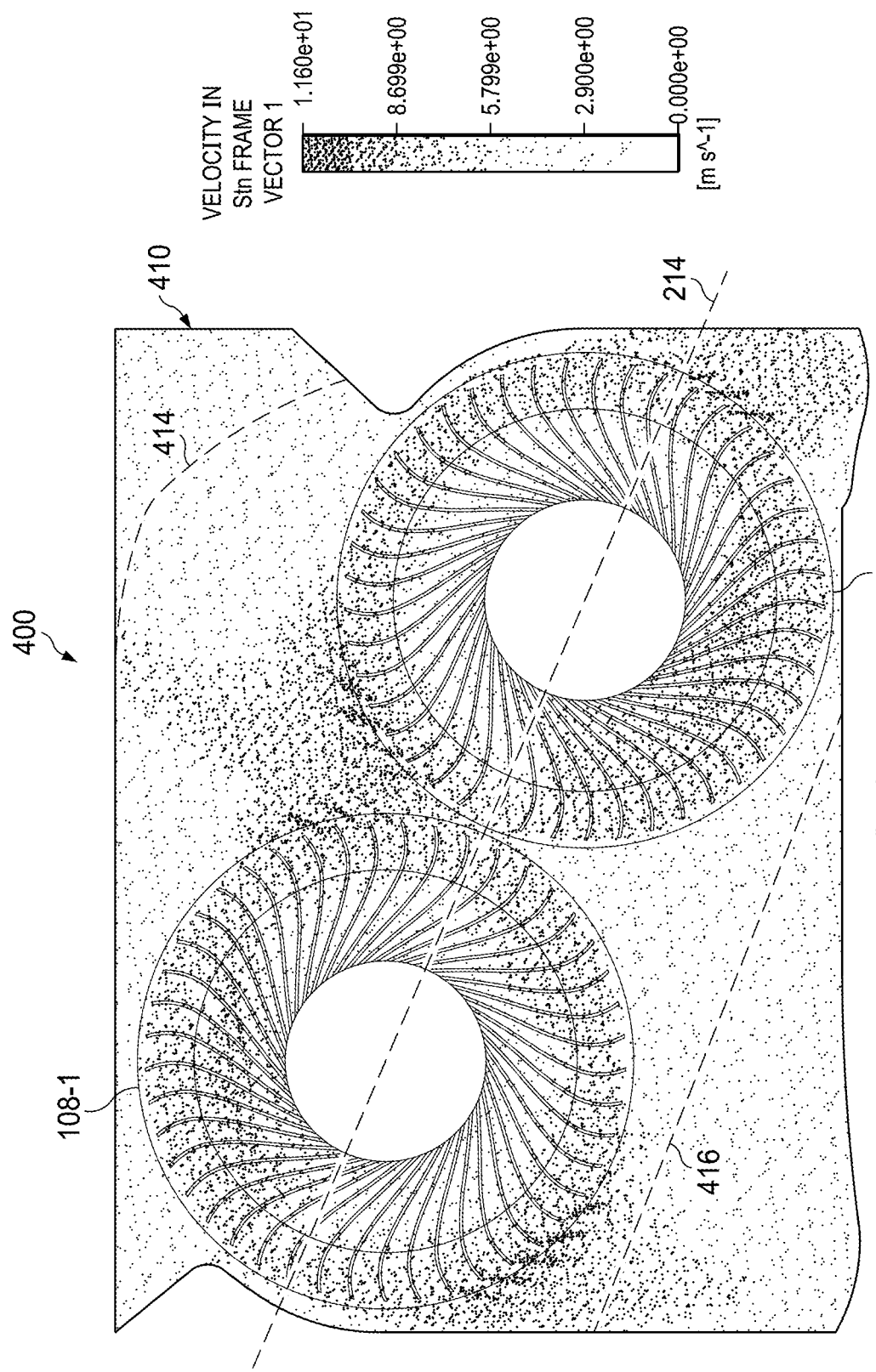
FIG. 4 depicts a simulated airflow profile for a fan having two impellers of the same size with centers of rotation aligned relative to an axis non-parallel with a rear surface of the portable chassis.

Larger Impellers with Axes of Rotation Aligned with an Axis of Orientation Non-Parallel with a Rear Surface May be Positioned in the Same Fan Area FIG. 4 depicts a simulated airflow velocity profile 400 of a cooling system comprising fan housing 410 containing two counterrotating impellers 108 of the same size generating an airflow, with the axes of rotation of impellers 108-1 and 108-2 being aligned relative to axis of orientation 214 that is non-parallel with rear surface 103 of portable chassis 102. The airflow generated by two counterrotating impellers 108 of equal size may exit fan housing 410 approximately orthogonal to axis 214. However, two impellers 108 with their axes of rotation aligned on axis of orientation 214 that is non-parallel with rear surface 103 of portable chassis 102 may have larger diameters than impellers 108 with their axes of rotation aligned on axis of orientation 214 that is parallel with rear surface 103 of portable chassis 102, generating increased volumetric airflow.

A velocity of airflow exiting fan housing 410 with impellers 108 aligned with axis of orientation 214 that is non-parallel with rear surface 103 may be less than a maximum possible velocity of airflow exiting fan housing 410, and may be less than a velocity of airflow exiting fan housing 310 with impellers 108 aligned with axis of orientation 214 that is parallel with rear surface 103. As depicted in FIG. 4, a velocity of airflow exiting fan housing 410 may reach approximately 3 m/s. However, the volumetric airflow may be increased and changing the angle of axis of orientation 214 to be non-parallel with rear surface 103 of portable chassis 102 may allow a larger portion of the airflow exiting a first fan outlet to be directed to a section of heat pipes 106 closer to a heat source (e.g., CPU 104) before exiting portable chassis 102.

Fan Housing with an Asymmetric Shape for Airflow Direction and Distribution

To further control the distribution and direction of an airflow exiting fan housing, embodiments of a cooling system may comprise fan housing 410 having an asymmetric shape relative to the fan width. Embodiments of a cooling system with fan housing 410 having an asymmetric shape may direct more airflow out a first fan outlet in a first direction and at a first airflow velocity for cooling components of information handling system 100.

An advantage of fan housing 410 depicted in FIG. 4 is that fan housing 410 may be formed with curved surfaces, indentations or may be truncated to accommodate other components in portable chassis 102. For example, to accommodate cabling or other components, fan housing 410 may be truncated along line 416 such that line 416 depicts a second fan outlet and the portion of fan housing 410 depicted below line 416 is not present. In some embodiments, to accommodate heat pipes 106 in portable chassis 102 (such as depicted in FIG. 1 or 2), fan housing 410 may be formed with curved line 414 depicting an outer surface of fan housing 410 or curved line 414 depicts a portion of a first fan outlet. Other variations in the shape of fan housing 410 may ensure airflow is distributed to components at the same flow rate or distribute airflow at different flow rates based on component performance requirements or user experience requirements.

FIG. 5 depicts a chart comparing total airflow generated by various cooling systems 502 in different configurations and size combinations, wherein all cooling systems 502 are sized to fit inside cooling area 112 comprising a fan area width of 100 mm and a fan area length of 70 mm, and all cooling systems 502 are operated at the maximum speed that would generate no more than 1.7 Sones of system acoustic noise.

Cooling system 502-1 is a common approach to cooling components in information handling systems 100 (as described above). Cooling system 502-1 comprises a single fan housing 110 with a single impeller 108. For fan area 112 having a fan area width of 100 mm and a fan area length of 70 mm, the fan housing length is the limiting dimension, such that impeller 108 may be limited to have a diameter less than or equal to 62 mm. Operating cooling system 502-1 at 1.7 Sones, impeller 108 may rotate at a rotational speed up to 2830 revolutions per minute (RPM) to generate a volumetric airflow of 6.8 cubic feet per minute (CFM). Fan housing 110 may be positioned along the fan area width as long as fan housing 110 does not interfere with heat pipes 106 or other components. Fan housing 110 having a symmetric shape may direct a first portion of airflow toward a vent in rear surface 103 of portable chassis 102 and a second portion of airflow into portable chassis 102.

Cooling system 502-2 comprises two impellers 108 in separate fan housings 110. For fan area 112 having a fan area width of 100 mm and a fan area length of 70 mm, the fan area width is the limiting dimension for square fan housing 110, such that each impeller 108 may be limited to have a diameter less than or equal to 44 mm. Operating cooling system 502-2 at 1.7 Sones, both impellers 108 (in separate fan housings 110) may rotate at rotational speeds up to 3450 revolutions per minute (RPM) such that cooling system 502-2 generates 7.7 cubic feet per minute (CFM), which is an improvement over cooling system 502-1. Each fan housing 110 may be positioned closer to or farther from rear surface 103 of portable chassis 102 to accommodate heat pipes 106 or other components. However, fan housings 110 having a generally square shape may cause fan housing 110 to be positioned farther from heat pipes 16. Furthermore, airflow exiting each fan housing 110 is directed in the same general direction. Thus, the full area of fan area 112 cannot be utilized and any airflow exiting fan housings 110 is not controlled other than by increasing or decreasing the speed of impellers 108.

Cooling system 502-3 comprises two counterrotating impellers 108 of the same diameter and with their axes of rotation aligned on an axis of orientation 214 that is non-parallel to rear surface 103 of portable chassis 102.

Advantageously, fan housing 410 sized to contain both impellers 108 in different configurations allows each impeller 108 to have a larger diameter than impellers 108 in cooling system 502-2. For fan area 112 having a fan area width of 100 mm and a fan area length of 70 mm, impellers 108 may be positioned such that their axes of rotation are aligned with axis of orientation 214. Thus, each impeller 108 may have an increased diameter as compared to impellers 108 in cooling system 502-2. In some embodiments, each impeller 108 may have a diameter up to 49 mm. Operating cooling system 502-3 at 1.7 Sones, each impeller 108 may rotate at a rotational speed up to 3162 revolutions per minute (RPM) such that cooling system 502-3 generates 8.3 cubic feet per minute (CFM). The ability to operate each impeller 108 at a lower rotational speed may reduce the power needed to cool components of information handling system 100. In some embodiments, the shape of a fan housing 410 containing impellers 108 may be configured to accommodate other components in portable chassis 102. Thus, although cooling system 502-3 is depicted relative to a rectangular fan area 112, fan housing 410 may be formed with curved sides and have a non-rectangular (including asymmetric) shape. As depicted in FIG. 5, first impeller 108-1 may be located on the right-hand side of second impeller 108-2 and the axis of rotation of second impeller 108-2 may be closer to rear surface 103 of portable chassis 102 such that axis of orientation 214 passing through both axes of rotation is oriented at a non-orthogonal angle relative to rear surface 103. In some embodiments, the angle may be selected such that airflow exiting a first fan outlet is directed to a selected set of components. In some embodiments, the angle may be selected such that airflow exiting a first fan outlet is directed to a section of heat pipes 106 closer to CPU 104.

Cooling system 502-4 comprises two counterrotating impellers 108 of different sizes with their axes of rotation aligned with axis of orientation 214 that is non-parallel with rear surface 103 of portable chassis 102. Various sizes of impellers 108 may be combined and configured for positioning in fan area 112 having a fan area width of 100 mm and a fan area length of 70 mm.

As depicted in FIG. 5, a first impeller 108 may have a diameter of 62 mm and a second impeller 108 may have a diameter of 30 mm. Operating cooling system 502-4 at 1.7 Sones, first impeller 108-1 may rotate up to 2462 revolutions per minute (RPM) and second impeller 108-2 may rotate up to 4924 RPM such that cooling system 502-4 generates a volumetric airflow of 8.2 cubic feet per minute (CFM). Embodiments of cooling system 502-4 with different combinations of impeller sizes and configurations may generate different volumetric airflows with different airflow profiles. In some embodiments, the shape of fan housing 410 containing impellers 108 may be configured to accommodate other components in portable chassis 102. Thus, although cooling system 502-4 is depicted in FIG. 5 relative to a rectangular fan area 112, cooling system 502-4 may comprise fan housing 410 formed with curved sides and have a non-rectangular (including asymmetric) shape. Notably, fan housing 410 containing impellers 108 of different sizes may have a shape that requires less fan area 112 than other fan housings but provide almost the same volumetric flow as cooling system 502-3 and be configured to accommodate other components in portable chassis 102. As depicted in FIG. 5, first impeller 108-1 is the larger impeller and is located on the right-hand side of second impeller 108-2 and second impeller 108-2 may be positioned closer to a rear surface (not shown) of portable chassis 102 such that axis of orientation 214 passing through both axes of rotation is oriented at an angle relative to rear surface 103. In some embodiments, the size and position of each impeller and the angle of axis of orientation 214 may be selected such that airflow exiting a first fan outlet is directed to a selected set of components. In some embodiments, the size and position of each impeller and the angle of axis of orientation 214 may be selected such that airflow exiting a first fan outlet is directed to a section of heat pipes 106 closer to CPU 104.

The rotational speed of each impeller 108 may be controlled individually or collectively. In some embodiments, each impeller 108 is coupled to a motor that is communicatively coupled to a controller. In other embodiments, both impellers are coupled to a single motor that is communicatively coupled to a controller. The controller communicates with at least one motor to generate airflow. In some embodiments, a controller ensures the rotational speeds of impellers 108 do not generate noise such as blade passing frequency noise. For example, referring to cooling system 502-4, a controller may ensure a rotational speed of first impeller 108-1 is 2462 RPM and a rotational speed of second impeller 108-2 is twice that speed (e.g., 4924 RPM). Other rotational speed ratios are possible for impellers 108 of different diameters. A controller may be implemented as a separate component or integrated with other components.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A cooling system for an information handling system in a portable chassis comprising a bottom cover, a fan area proximate one or more of a heat pipe and a component, and a rear surface, the cooling system comprising:
 a fan housing positioned in the fan area, the fan housing comprising:
  a first side defining a fan housing width;
  a second side defining a fan housing length less than the fan housing width;
  an inlet proximate the bottom cover of the portable chassis; and
  a fan outlet on a third side of the fan housing;
 a first impeller positioned in the fan housing and configured to rotate in a first direction about a first axis of rotation;
 a second impeller positioned in the fan housing and configured to rotate in a second direction opposite the first direction about a second axis of rotation; and
 a controller operable to cause the first impeller to rotate at a first rotational speed and the second impeller to rotate at a second rotational speed, wherein:
  the first impeller and the second impeller rotate to generate an airflow,
  the axes of rotation of the first impeller and the second impeller are aligned with an axis of orientation that is non-parallel with the first side of the fan housing and the second side of the fan housing, wherein the axis of orientation forms a non-orthogonal angle with respect to the rear surface, wherein a magnitude of the non-orthogonal angle is based on a positioning of the heat pipe with respect to the component such that the airflow is directed to the heat pipe, and
  wherein the fan housing has a shape configured to direct the airflow to the heat pipe.

2. The cooling system of claim 1, wherein:
 the first side of the fan housing has a truncated shape;
 the first impeller has a first diameter; and
 the second impeller has a second diameter less than the first diameter based on the truncated shape.

3. The cooling system of claim 1, wherein:
 the fan housing has a curved portion;
 the first impeller has a first diameter; and
 the second impeller has a second diameter less than the first diameter based on the curved portion.

4. The cooling system of claim 3, wherein the fan housing is positioned in the fan area with the curved portion proximate the heat pipe.

5. The cooling system of claim 1, wherein the fan housing is asymmetric relative to the fan width.

6. The cooling system of claim 1, wherein the first impeller and the second impeller have approximately the same diameter.

7. The cooling system of claim 1, wherein: the first impeller has a first diameter; the second impeller has a second diameter smaller than the first diameter; and the controller is configured to operate the first impeller at the first rotational speed and operate the second impeller at the second rotational speed greater than the first rotational speed.

8. The cooling system of claim 7, wherein the first rotational speed is proportional to the second rotational speed.

9. An information handling system, comprising: a heat pipe; a component; a portable chassis, including: a bottom cover; a fan area proximate to one or more of the heat pipe and the component; a rear surface; a fan housing positioned in the fan area, the fan housing comprising: a first side defining a fan housing width; a second side defining a fan housing length less than the fan housing width; an inlet proximate an opening in the bottom cover of the portable chassis; and a fan outlet on a third side of the fan housing; a first impeller positioned in the fan housing and configured to rotate in a first direction about a first axis of rotation; a second impeller positioned in the fan housing and configured to rotate in a second direction opposite the first direction about a second axis of rotation; and a controller operable to cause the first impeller to rotate at a first rotational speed and the second impeller to rotate at a second rotational speed, wherein: the first impeller and the second impeller rotate to generate an airflow, the axes of rotation of the first impeller and the second impeller are aligned with an axis of orientation that is non-parallel with the first side of the fan housing and the second side of the fan housing, wherein the axis of orientation forms a non-orthogonal angle with respect to the rear surface of the portable chassis, wherein a magnitude of the non-orthogonal angle is based on a positioning of the heat pipe with respect to the component such that the airflow is directed to the heat pipe; and wherein the fan housing has a shape configured to direct of the airflow to the heat pipe.

10. The information handling system of claim 9, wherein the heat pipe has a curvature and the third side of the fan housing comprises a curved portion proximate the fin stack.

11. The information handling system of claim 9, wherein the third side of the fan housing has a truncated shape.

12. The information handling system of claim 9, wherein the fan housing is asymmetric relative to the fan housing width.

13. The information handling system of claim 9, wherein the first impeller and the second impeller have approximately the same diameter.

14. The information handling system of claim 9, wherein: the first impeller has a first diameter; the second impeller has a second diameter smaller than the first diameter; and the controller is configured to operate the first impeller at the first rotational speed and operate the second impeller at the second rotational speed greater than the first rotational speed.

15. The information handling system of claim 14, wherein the first rotational speed is proportional to the second rotational speed.

16. The cooling system of claim 1, wherein i) a size of the first impeller, ii) a positioning of the first impeller within the fan housing, iii) a size of the second impeller, and iv) a positioning of the second impeller within the fan housing are all based on the positioning of the heat pipe with respect to the component such that the airflow is directed to the heat pipe.

* * * * *